United States Patent
Kokame et al.

(10) Patent No.: US 9,929,378 B2
(45) Date of Patent: Mar. 27, 2018

(54) ORGANIC EL DISPLAY DEVICE

(71) Applicant: Japan Display Inc., Tokyo (JP)

(72) Inventors: Hiraaki Kokame, Tokyo (JP); Daisuke Kato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/294,927

(22) Filed: Oct. 17, 2016

(65) Prior Publication Data
US 2017/0194601 A1 Jul. 6, 2017

(30) Foreign Application Priority Data
Jan. 4, 2016 (JP) .................................. 2016-000104

(51) Int. Cl.
*H01L 51/52* (2006.01)
*H01L 27/32* (2006.01)

(52) U.S. Cl.
CPC ...... *H01L 51/5259* (2013.01); *H01L 27/3258* (2013.01); *H01L 27/3276* (2013.01); *H01L 51/524* (2013.01); *H01L 51/5253* (2013.01)

(58) Field of Classification Search
CPC . H01L 51/52; H01L 51/5259; H01L 51/5048; H01L 52/5029; H01L 27/3258; H01L 27/3276; H01L 5/5029; H01L 27/32761
See application file for complete search history.

(56) References Cited

U.S. PATENT DOCUMENTS

| | | | |
|---|---|---|---|
| 8,766,241 B2 * | 7/2014 | Yamazaki | H01L 27/3246 257/40 |
| 2011/0163331 A1 | 7/2011 | Yamazaki et al. | |
| 2011/0198630 A1 | 8/2011 | Sumita et al. | |
| 2013/0069085 A1 * | 3/2013 | Kang | H01L 51/56 257/88 |
| 2016/0043320 A1 * | 2/2016 | Kwon | H01L 51/0013 156/230 |
| 2016/0149155 A1 * | 5/2016 | Kim | H01L 51/5228 257/40 |

FOREIGN PATENT DOCUMENTS

| | | |
|---|---|---|
| JP | 2009-295911 A | 12/2009 |
| JP | 2011-191739 A | 9/2011 |
| JP | 2013-084619 A | 5/2013 |

* cited by examiner

*Primary Examiner* — Phuc Dang
(74) *Attorney, Agent, or Firm* — Typha IP LLC

(57) ABSTRACT

Provided is a highly reliable organic EL display device. The organic EL display device includes a first insulating layer; and a display portion provided on the first insulating layer, the display portion including a plurality of pixels. The display portion includes a light emitting layer included in organic EL elements included in the plurality of pixels, the light emitting layer being extended in the entirety of, and beyond, the display portion. The organic EL display device further includes a first groove enclosing the display portion as seen in a plan view, the first groove being provided in the first insulating layer at a position below the light emitting layer. A second insulating layer covering the first groove may be provided between the first insulating layer and the light emitting layer.

9 Claims, 12 Drawing Sheets

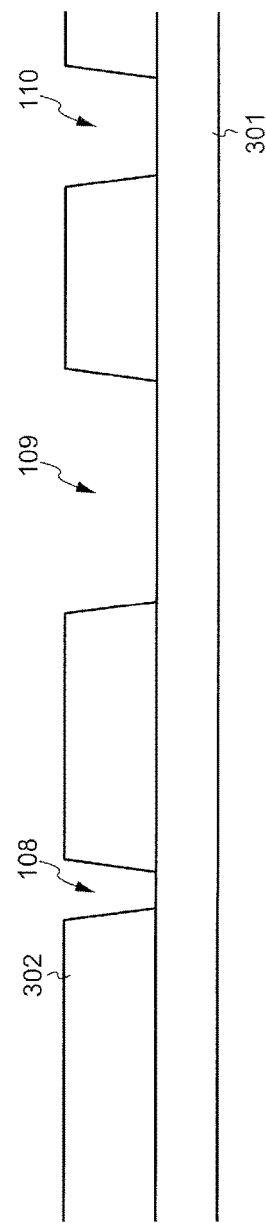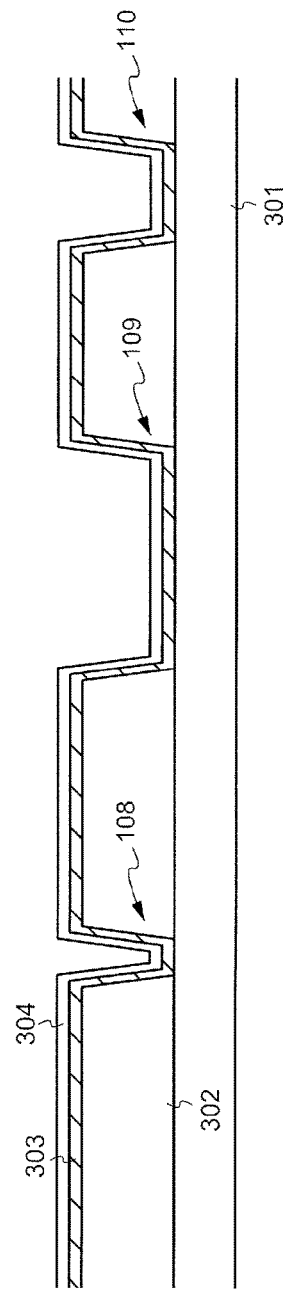

ORGANIC EL DISPLAY DEVICE

CROSS REFERENCE TO RELATED APPLICATIONS

This application is based upon and claims the benefit of priority from the prior Japanese Patent Application No. 2016-000104 filed on 4 Jan. 2016, the entire contents of which are incorporated herein by reference.

FIELD

The present invention relates to an organic EL display device including a display portion including a plurality of organic EL elements.

BACKGROUND

Recently, organic EL display devices (referred to as "OLED display devices") have been actively developed as display devices including, as light sources, light emitting elements using an electroluminescence (EL) phenomenon. An organic EL display device includes an organic EL element as a light emitting element in each of pixels, and displays an image on a display portion by controlling light emission of the organic EL element.

Such an organic EL element includes a light emitting layer formed of an organic material provided between an anode and a cathode. Since the light emitting layer formed of an organic material is weak against moisture, the organic EL display device usually has a structure preventing entrance of moisture from outside. For example, Japanese Laid-Open Patent Publications Nos. 2011-191739, 2013-84619 and 2009-295911 disclose a technology suppressing deterioration of an organic EL element by moisture.

SUMMARY

An organic EL display device in an embodiment according to the present invention includes a first insulating layer; and a display portion provided on the first insulating layer, the display portion including a plurality of pixels. The display portion includes a light emitting layer included in organic EL elements included in the plurality of pixels, the light emitting layer being extended in the entirety of, and beyond, the display portion. The organic EL display device further includes a first groove enclosing the display portion as seen in a plan view, the first groove being provided in the first insulating layer at a position below the light emitting layer. A second insulating layer covering the first groove may be provided between the first insulating layer and the light emitting layer.

BRIEF DESCRIPTION OF DRAWINGS

FIG. 6A is a cross-sectional view showing a step of a process for producing the organic EL display device in embodiment 1;

FIG. 6B is a cross-sectional view showing a step of the process for producing the organic EL display device in embodiment 1;

DESCRIPTION OF EMBODIMENTS

Figure 1:
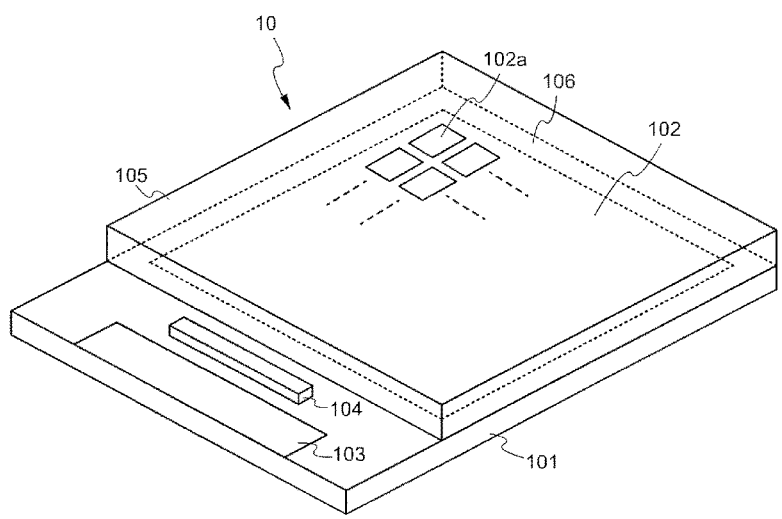
FIG. 1 is a schematic view showing a structure of an organic EL display device in embodiment 1 according to the present invention.

The present invention has an object of providing a highly reliable organic EL display device that suppresses entrance of moisture to a display portion.

Hereinafter, embodiments of the present invention will be described with reference to the drawings and the like. The present invention may be carried out in various other embodiments without departing from the gist thereof, and should not be construed as being limited to any of the following embodiments.

In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those described or shown previously bear the identical reference signs thereto, and overlapping descriptions thereof may be omitted.

In this specification, the terms "on", "above" and "below" used to provide a description with reference to the drawings represent a positional relationship between a layer or a component and a substrate on which the layer or the component is provided. For example, the term "on" or "above" refers to a direction distancing away from the substrate, and the term "below" refers to a direction approaching the substrate. The expressions "outer" and "inner" represent a positional relationship between a component and a display portion. For example, the term "outer" refers to a direction distancing away from the display portion, and the term "inner" refers to a direction approaching the display portion.

Embodiment 1

<Structure of the Display Device>

FIG. 1 schematically shows a structure of an organic EL display device 10 in embodiment 1. The organic EL display device 10 includes an array substrate 101 including a display portion (display region) 102. The organic EL display device 10 also includes a terminal portion 103 supplying an external signal to the display portion 102, a driving integrated circuit 104 located between the display portion 102 and the terminal portion 103, and a counter substrate 105 located to face the array substrate 101. The display portion includes a plurality of pixels 102a.

The array substrate 101 includes a pixel array formed by use of semiconductor devices such as thin film transistors or the like, and is also called as an "active matrix substrate". The pixels 102a are arrayed in a matrix and are included in the display portion 102. In this specification, a region in the array substrate 101 other than the display portion 102 will be referred to as a "peripheral portion 106" for the sake of convenience.

FIG. 1 shows an example in which the driving integrated circuit 104 is provided to drive the thin film transistors included in the display portion 102. Alternatively, a gate driver circuit and a source driver circuit provided by thin film transistors in the array substrate 101 may be located in the peripheral portion 106, and these driver circuits may be driven by the driving integrated circuit 104. The driving integrated circuit 104 may be formed by external IC chips or the like.

Figure 2:
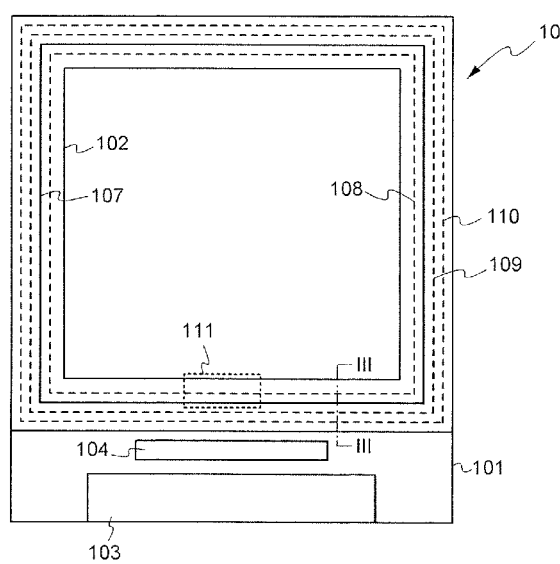
FIG. 2 is a plan view showing the structure of the organic EL display device in embodiment 1.
Figure 3:
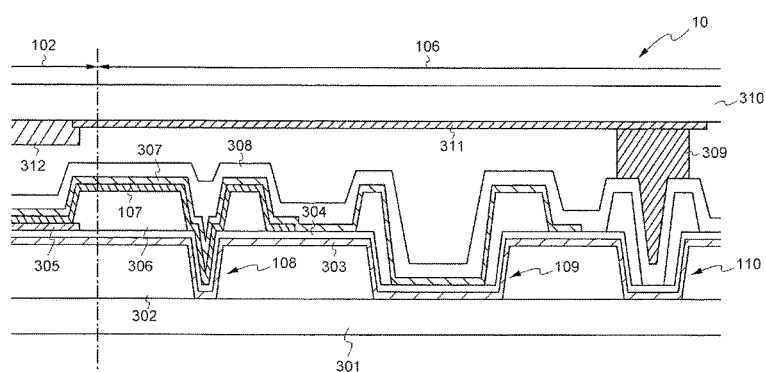
FIG. 3 is a cross-sectional view of the organic EL display device in embodiment 1.

FIG. 2 is a plan view showing the structure of the organic EL display device 10 in embodiment 1. As shown in FIG. 2, the organic EL display device 10 includes a light emitting layer 107 included in organic EL elements. The light emitting layer 107 is provided to extend in the entirety of, and beyond, the display portion 102. Namely, an outer profile of the light emitting layer 107 is located outer to an outer profile of the display portion 102 as seen in a plan view. Referring to FIG. 3, the "display portion 102" is a region including the matrix of pixels 102a. Namely, the display portion 102 includes a part of the light emitting layer 107 positionally corresponding to the matrix of pixels 102a.

In the organic EL display device 10 in embodiment 1, the light emitting layer 107 included in the organic EL elements in the pixels 102a emits white light, and color separation is realized by use of color filters. Therefore, the light emitting layer 107 is formed as a layer common to the pixels 102a included in the display portion 102. In addition to the light emitting element 107 shown in this example, other known functional layers such as an electron injection layer, an electron transfer layer, a hole injection layer, a hole transfer layer and the like may be provided.

The organic EL display device 10 in embodiment 1 includes a first groove 108 enclosing the display portion 102 as seen in a plan view. The first groove 108 is provided inner to the outer profile of the light emitting layer 107 as seen in a plan view. The organic EL display device 10 also includes a second groove 109 enclosing the light emitting layer 107. The second groove 109 is provided inner to a sealing member 309 described below. The organic EL display device 10 further includes a third groove 109 provided below the sealing member 309.

The first groove 108, the second groove 109 and the third groove 110 are opening formed by etching out a part of a first insulating layer 302 provided below the light emitting layer 107 (shown in FIG. 3), and act as a moisture blocking element preventing moisture from reaching the display portion 102 as described below. As described above, the first groove 108, the second groove 109 and the third groove 110 are formed in the peripheral portion 106.

FIG. 3 is a cross-sectional view of the organic EL display device 10 in embodiment 1. Specifically, FIG. 3 is a cross-sectional view taken along one-dot chain line III-III in FIG. 2.

As shown in FIG. 3, the first insulating layer 302 is provided on a first substrate 301. In this example, the first substrate 301 includes a glass substrate (glass substrate 403 shown in FIG. 5 and described below) and various circuits that are provided on the glass substrate and are formed of semiconductor devices such as thin film transistors (not shown) or the like. The first insulating layer 302 is formed of a resin such as polyimide, polyamide, acrylic resin or the like. In the organic EL display device 10, the first insulating layer 301 acts as a flattening layer.

The first insulating layer 302 is partially etched out to have the first groove 108, the second groove 109 and the third groove 110 formed therein. As described above, the first groove 108, the second groove 109 and the third groove 110 act as the moisture blocking elements that prevent the entrance of moisture to the display portion 102 via the first insulating layer 302.

The display portion 102 is basically covered with a protective layer 308 described below or the like so as to prevent the entrance of moisture from above the organic EL elements. However, there is still an undesirable possibility that moisture may enter in a lateral direction via the first insulating layer 302 provided as the flattening layer. With an assumption of such a situation, the above-described moisture blocking elements are provided by removing a part of the insulating layer 302 to prevent the entrance of moisture.

Especially the first groove 108 shown in FIG. 3 is provided to prevent the entrance of moisture via a scratch that may be caused during the formation of the light emitting layer 107, and is one of features of the organic EL display device 10 in embodiment 1. The entrance of moisture via a scratch that may be caused during the formation of the light emitting layer 107 will be described below.

On the first insulating layer 302, a conductive layer 303 and a second insulating layer 304 are provided sequentially in a stack. In embodiment 1, the conductive layer 303 is formed of a stack of molybdenum (Mo) and aluminum (Al), and the second insulating layer 304 is formed of silicon nitride (SiN). The conductive layer 303 and the second insulating layer 304 are not limited to being formed of the material(s) described above.

In this embodiment, the conductive layer 303 and the second insulating layer 304 are provided on the first insulating layer 302. Alternatively, the conductive layer 303 and the second insulating layer 304 may be omitted.

On the second insulating layer 304, a positive electrode 305 of the organic EL element is provided. In embodiment 1, the positive electrode 305 is formed of a stack of aluminum (Al) and ITO (Indium Tin Oxide). The positive electrode 305 also acts as a pixel electrode provided in each of the pixels 102a included in the display portion 102. In the organic EL display device 10 in embodiment 1, a stack of the conductive layer 303, the second insulating layer 304 and the positive electrode 305 is positively used as a capacitance connected with the organic EL element.

Also on the second insulating layer 304, a bank 306 formed of a resin is provided. The bank 306 demarcates the pixels 102a in the display portion 102, and is provided to enclose each pixel 102a as seen in a plan view. Namely, the bank 306 is located between the positive electrodes 305 so as to cover an end of each positive electrode 305.

When a resin layer is etched to form the bank 306, the resin layer is removed from areas above the first groove 108, the second groove 109 and the third groove 110. The resin layer left in the peripheral portion 106 does not act as a bank in a strict sense, but will be referred to as a "bank" for the sake of convenience.

The light emitting layer 107 of the organic EL element is provided to cover the positive electrode 305 and the bank 306. As shown in FIG. 3, the light emitting layer 107 is extended to a position covering the first groove 108. Specifically, the light emitting layer 107 is provided such that an end thereof is located between the first groove 108 and the second groove 109.

On the light emitting layer 107, a negative electrode 307 of the organic EL element is provided. In this embodiment, the negative electrode 307 is provided such that an end thereof is located between the second groove 109 and the third groove 110. The negative electrode 307 is not limited to being located in such a manner. The negative electrode 307 may be provided such that an end thereof is located between the first groove 108 and the second groove 109.

On the negative electrode 307, the protective layer 308 is provided. In embodiment 1, the protective layer 308 is formed of silicon nitride. Alternatively, the protective layer 308 may be formed of a resin.

An assembly of the first substrate 301, the protectively layer 308 and the components provided between the first substrate 301 and the protectively layer 308 corresponds to the array substrate 101 shown in FIG. 1. A counter substrate 105 is bonded to the array substrate 101 by the sealing member 309 formed of a resin. In embodiment 1, the counter substrate 105 includes a second substrate 310 formed of glass or the like, a black mask (light blocking layer) 311 and color filters 312. The black mask 311 may be formed of, for example, a resin containing a black pigment dispersed therein. The color filters 312 may be each formed of a resin containing a known pigment having a desired absorption spectrum dispersed therein.

FIG. 3 shows an example in which the sealing member 309 is used to bond the counter substrate 105 and the array substrate 101 to each other. Alternatively, the protective layer 308 may be used as an adhesive to bond the counter substrate 105 and the array substrate 101 to each other. In the case where the sealing member 309 is used, a space between the array substrate 101 and the counter substrate 105 may be filled with an insulating layer formed of a resin or the like.

Figure 4:
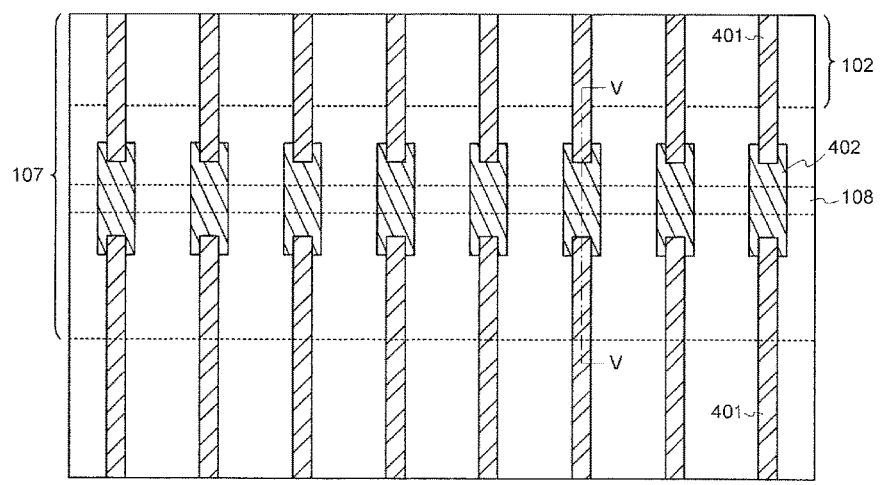
FIG. 4 is a plan view showing a first groove and the vicinity thereof of the organic EL display device in embodiment 1.

In the organic EL display device 10 in embodiment 1, a plurality of lines 401 (FIG. 4) connecting the display portion 102 and the terminal portion 103 (FIG. 2) to each other in an area where the first groove 108 is located are each included in a bridge structure. FIG. 4 is a schematic plan view of the first groove 108 and the vicinity thereof in the organic EL display device 10 in embodiment 1. Specifically, FIG. 4 shows an enlarged view of area represented by rectangle 111 in the plan view of FIG. 2.

The plurality of lines 401 transmitting a signal to the pixels 102a included in the display portion 102 electrically connect the display portion 102 and the terminal portion 103 to each other. The first groove 108 is located to enclose the display portion 102, and thus, as shown in FIG. 4, is located to cross the plurality of lines 401. If the lines 401 are not each included in the bridge structure, the lines 401 are exposed at the bottom of the first groove 108. In such a case, the lines 401 are shortcircuited with the conductive layer 303.

Therefore, in the organic EL display device 10 in embodiment 1, a conductive layer 402 provided below the lines 401 is used to form a bridge structure. More specifically, in an area where each line 401 crosses the first groove 108, the line 401 is physically disconnected and the disconnected segments of the line 401 are electrically connected with each other via the conductive layer 402 provided below the lines 401. In this manner, the electric connection of the display portion 102 and the terminal portion 103 is guaranteed.

Figure 5:
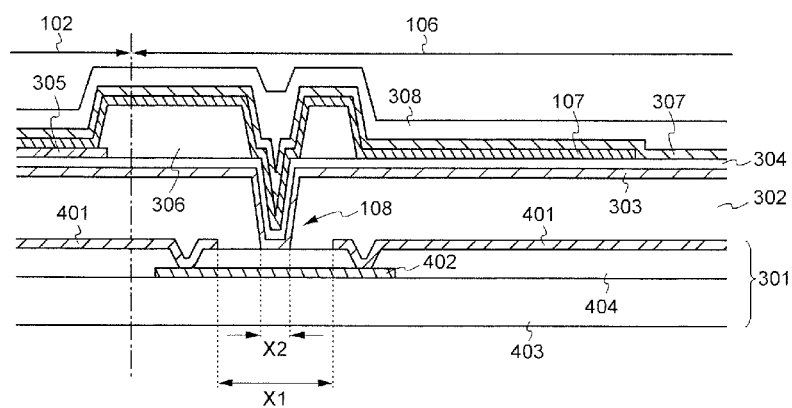
FIG. 5 is a cross-sectional view showing the first groove and the vicinity thereof of the organic EL display device in embodiment 1.

FIG. 5 is a schematic cross-sectional view of the first groove 108 and the vicinity thereof in the organic EL display device 10 in embodiment 1. Specifically, FIG. 5 is a schematic cross-sectional view taken along one-dot chain line V-V in the plan view of FIG. 4.

As shown in FIG. 5, the first substrate 301 includes the glass substrate 403, the conductive layer 402, an insulating layer (third insulating layer) 404 and the line 401. The conductive layer 402, the insulating layer 404 and the line 401 may be formed in the same step as the thin film transistor located in each of the pixels 102a included in the display portion 102.

For example, the conductive layer 402 may be formed of the same metal layer as a gate electrode of the thin film transistor. The line 401 may be formed of, for example, the same metal layer as a source electrode and a drain electrode of the thin film transistor. The conductive layer 402 and the line 401 are not limited to being formed of such a layer and may be formed of any appropriately layer.

As shown in FIG. 5, the line 401 disconnected into the segments having the first groove 108 therebetween are connected to the conductive layer 402 via an opening (contact hole) formed in the insulating layer 404. This provides a bridge structure including the line 401 and the conductive layer 402 to bridge over the first groove 108 (in FIG. 3, the bridge structure is below the first groove 108). Thus, the line 401 and the conductive layer 402 are prevented from shortcircuiting, and also the electric connection of the display portion 102 and the terminal portion 103 is guaranteed. In order to prevent the shortcircuiting effectively, it is preferable that width X1 of a gap between the segments of the line 401 is sufficiently greater than width X2 of the first groove 108. In this embodiment, the bridge structure is described regarding the first groove 108. The second groove 109 and the third groove 110 are also each included in a similar bridge structure.

As described above, the organic EL display device 10 in embodiment 1 includes the first groove 108, the second groove 109 and the third groove 110 as moisture blocking elements suppressing the entrance of moisture from outside. Especially, the first groove 108 is provided in the first insulating layer 302 located below the light emitting layer 107 so as to enclose the display portion 102 as seen in a plan view.

Now, a moisture entrance route from a scratch that may be caused during the formation of the light emitting layer 107 will be described.

Figure 11:
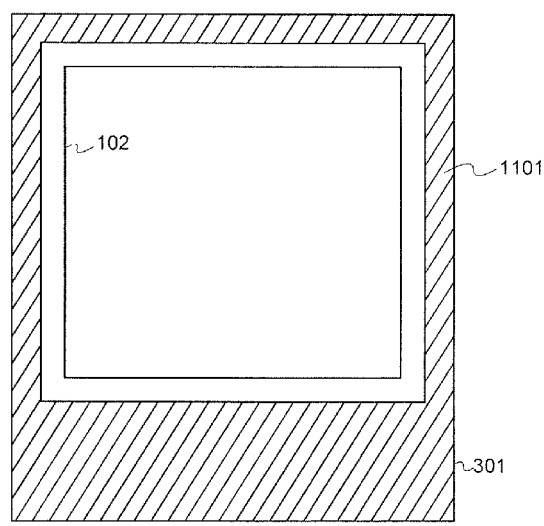
FIG. 11 is a plan view showing a step of a process for producing an organic EL display device in a comparative example.
Figure 12A:
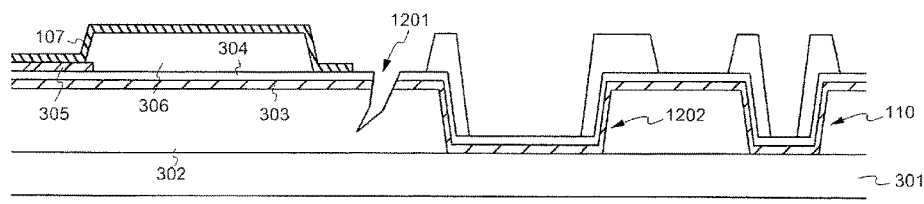
FIG. 12A is a cross-sectional view showing a step of the process for producing an organic EL display device in the comparative example.
Figure 12B:
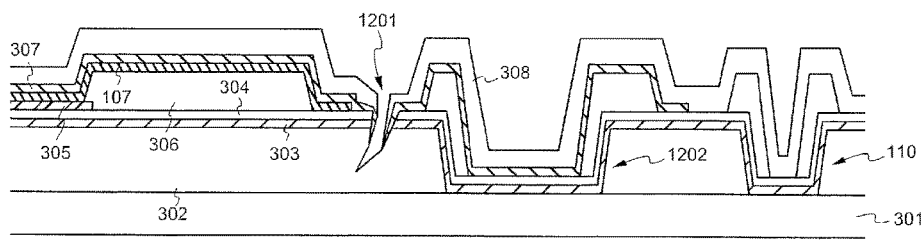
FIG. 12B is a cross-sectional view showing a step of the process for producing an organic EL display device in the comparative example.

FIG. 11 is a plan view showing a step of a process for producing an organic EL display device in a comparative example. Specifically, FIG. 11 shows an example in which a light emitting layer is formed by use of a vapor deposition mask. FIG. 12A and FIG. 12B are each a cross-sectional view showing a step of the process for producing the organic EL display device in the comparative example. Specifically, FIG. 12A and FIG. 12 show a structure without the first groove 108. For simplifying the description, the same components as those in the organic EL display device 10 in embodiment 1 will bear the same reference signs therewith.

As shown in FIG. 11, in the case where the light emitting layer 107 is formed by a vapor deposition method, a region (hatched region) other than the display portion 102 is covered with a vapor deposition mask 1101. As described above, the light emitting layer 107, which is provided commonly to all the pixels, is formed of a material that emits white light. Therefore, the vapor deposition mask 1101 has an opening that exposes the entirety of the display portion 102.

In this state, the vapor deposition mask 1101 and the first substrate 301, which is a target of vapor deposition, are very close to each other. Therefore, if, for example, a foreign substance or the like is located below the vapor deposition mask 1101, the layers on the first substrate 301 may be scratched. Namely, as shown in FIG. 12A, a region outer to the light emitting layer 107 (region that may contact the vapor deposition mask 1101) may have a scratch 1201 caused by the foreign substance or the like.

If the scratch 1201 is caused at such a position, as shown in FIG. 12B, the protective layer 308 may not possibly cover the scratch 1201 and may permit moisture to enter through the scratch 1201. Namely, even if the second groove 109 is provided in order to prevent the entrance of moisture from outside, moisture may enter at a position inner to the second groove 109. The moisture entering through the scratch 1201 advances toward the display portion 102 along with time and may deteriorate the organic EL elements included in the display portion 102 or the circuits.

By contrast, in the organic EL display device 10 in embodiment 1, the first groove 108 is provided as the moisture blocking element below the light emitting layer 107. Therefore, even if a scratch is caused by use of the vapor deposition mask during the formation of the light emitting layer 107, the entrance of moisture to at least the display portion 102 is prevented. Thus, the organic EL display device 10 is highly reliable.

<Process for Producing the Organic EL Display Device>

Now, a process for producing the organic EL display device 10 in embodiment 1 will be described with reference to FIG. 6A through FIG. 8B.

First, as shown in FIG. 6A, the first insulating layer 302 is formed on the first insulating substrate 301. The first substrate 301 may include a substrate formed of any material, and includes a glass substrate in this embodiment. In this embodiment, the first insulating layer 302 has a thickness of 10 to 30 μm (typically, 20 μm) and is formed of polyimide. The first insulating layer 302 may be formed of any other resin such as an acrylic resin or the like instead of polyimide.

In the first insulating layer 302, the first groove 108, the second groove 109 and the third groove 103 are formed. The first insulating layer 302 may be formed of, for example, a photosensitive resin, and each of the grooves 108, 109 and 110 may be formed by, for example, patterning. The grooves 108, 109 and 110 may each be considered as an opening reaching the first substrate 301. Which of the layers included in the first substrate 103 is exposed at the bottom of each groove may be appropriately determined.

Next, as shown in FIG. 6B, the conductive layer 303 and the second insulating layer 304 are formed on the first insulating layer 302 having the first groove 108, the second groove 109 and the third groove 110 formed therein. The conductive layer 303 and the second insulating layer 304 are each formed of a known film formation method. In this example, as described above, the conductive layer 303 is formed by stacking molybdenum (Mo) and aluminum (Al), and then the second insulating layer 304 is formed of silicon nitride (SiN). As a result, an inside surface (inside wall) of each of the first groove 108, the second groove 109 and the third groove 110 is covered with the second insulating layer 304 formed of silicon nitride. This suppresses the entrance of moisture to the display portion 102 more effectively.

Figure 7A:
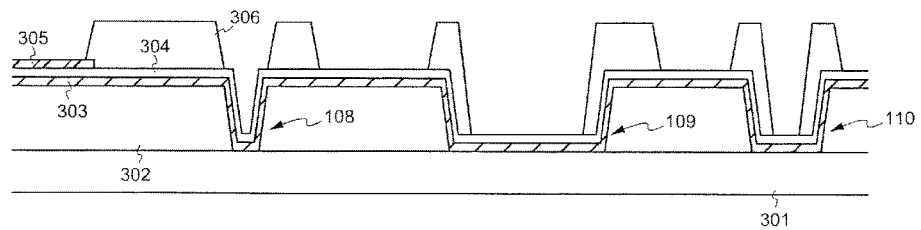
FIG. 7A is a cross-sectional view showing a step of the process for producing the organic EL display device in embodiment 1.

Next, as shown in FIG. 7A, the positive electrode 305 is formed on the second insulating layer 304. The positive electrode 305 also acts as a pixel electrode of each of the pixels 102a included in the display portion 102. A plurality of such positive electrodes 305 are arrayed in a matrix. In this example, the positive electrode 305 is formed of a stack structure including ITO films and an aluminum film held between the ITO films.

After the positive electrode 305 is formed, a resin layer is formed on the resultant assembly of the layers and patterned to form the bank 306. In the step of forming the bank 306, the resin layer is removed from the areas above the first groove 108, the second groove 109 and the third groove 110 as shown in FIG. 7A. In the example shown in FIG. 7A, the resin layer is etched away from the area above the first groove 108 in a width greater than the width of the first groove 108, whereas the resin layer is etched away from the areas above the second groove 109 and the third groove 109 in widths smaller than the widths of the second groove 109 and the third groove 110 respectively. The manner of etching the resin layer is not limited to this.

Figure 7B:
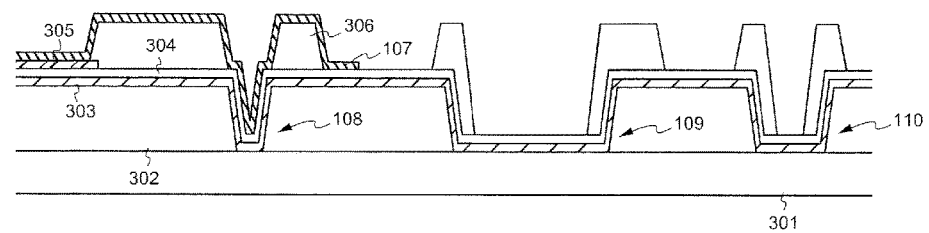
FIG. 7B is a cross-sectional view showing a step of the process for producing the organic EL display device in embodiment 1.

Next, as shown in FIG. 7B, the light emitting layer 107 is formed to extend in the entirety of, and beyond, the display portion 102 while covering the first groove 108. The light emitting layer 107 may be formed by a method using the vapor deposition mask 1101 shown in FIG. 11. In this step, as described above with reference to FIG. 12A and FIG. 12B regarding the comparative example, there is a possibility that the scratch 1201 is caused by the use of the vapor deposition mask 1101. However, in the organic EL display device 10 in embodiment 1, the first groove 108 is provided inner to the position at which the scratch 1201 may be caused (the first groove 108 is provided closer to the display portion 102 than the position at which the scratch 1201 may be caused). Therefore, the entrance of moisture to the display portion 102 via the first insulating layer 302 is suppressed.

Figure 8A:
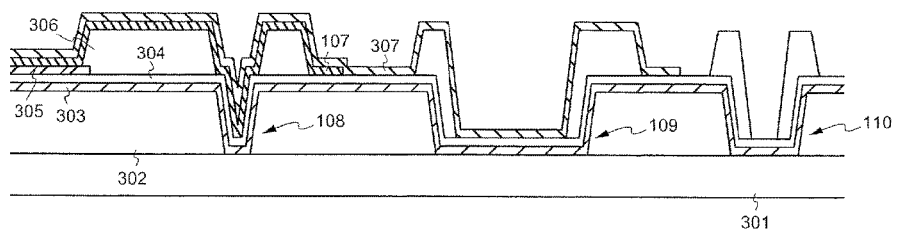
FIG. 8A is a cross-sectional view showing a step of the process for producing the organic EL display device in embodiment 1.

Next, as shown in FIG. 8A, the negative electrode 307 is formed. The negative electrode 307 may be formed of a transparent conductive material such as ITO or the like, or a metal material such as, for example, a compound of an alkaline metal and silver (e.g., MgAg). In the organic EL display device 10 in embodiment 1, light generated in the light emitting layer 107 is transmitted through the negative electrode 307 and output to outside. Therefore, it is preferable that the thickness of the negative electrode 307 is determined in consideration of the light transmittance. In the case where the negative electrode 307 contains an alkaline metal such as magnesium or the like, it is preferable that the negative electrode 307 is formed immediately after the light emitting layer 107 is formed without exposing the light emitting layer 107 to the air. A reason for this is that an alkaline metal such as magnesium is very weak against moisture.

Figure 8B:
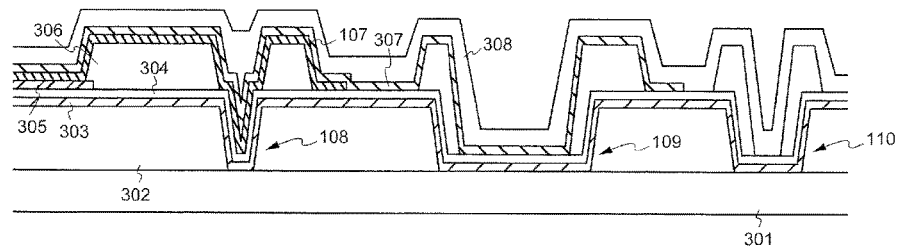
FIG. 8B is a cross-sectional view showing a step of the process for producing the organic EL display device in embodiment 1.

Next, as shown in FIG. 8B, the protective layer 308 is formed. In this example, the protective layer 308 is formed of silicon nitride by sputtering. Silicon nitride is fine in texture and thus is preferable for the protective layer 308. The protective layer 308 is provided in substantially the entirety of the array substrate 101 including the display portion 102 except for the terminal portion 103. Therefore, the protective layer 308 suppresses the entrance of moisture from above the organic EL display device 10 effectively.

In a final step, the counter substrate 105 including the black mask 311 and the color filters 312 is bonded to the array substrate 310 by use of the sealing member 309. Thus, the organic EL display device 10 shown in FIG. 3 is produced. The black mask 311 and the color filters 312 may be formed by a known method. The sealing member 309 may be provided above the third groove 110 so that the position at which the sealing member 309 is provided by application is controlled more accurately.

The organic EL display device 10 in embodiment 1 uses the protective layer 308 to suppress the entrance of moisture from above the organic EL display device 10 and also uses the first groove 108, the second groove 109 and the third groove 110 to suppress the entrance of moisture via the insulating layer 302. Especially, the first groove 108 provided below the light emitting layer 107 suppresses the entrance of moisture effectively even in the case where an area outer to the light emitting layer 107 is scratched. These arrangements improve the reliability of the organic EL display device 10.

In embodiment 1, the second groove 109 and the third groove 110 are provided in addition to the first groove 108. The organic EL display device 10 is not limited to having such a structure, and one of, or both of, the second groove 109 and the third groove 110 may be omitted. It is preferable that the second groove 109 is provided in addition to the first groove 108 from the point of view of reliability. However, the effect of blocking the moisture is not spoiled even where neither the second groove 109 nor the third groove 110 is provided.

There is no specific limitation on the width (size in the lateral direction in FIG. 3) of the first groove 108. In order to improve the effect of blocking the moisture, it is preferable that the width is as great as possible. For example, the first groove 108 and the second groove 109 may have an equal width to each other.

Embodiment 2

Figure 9:
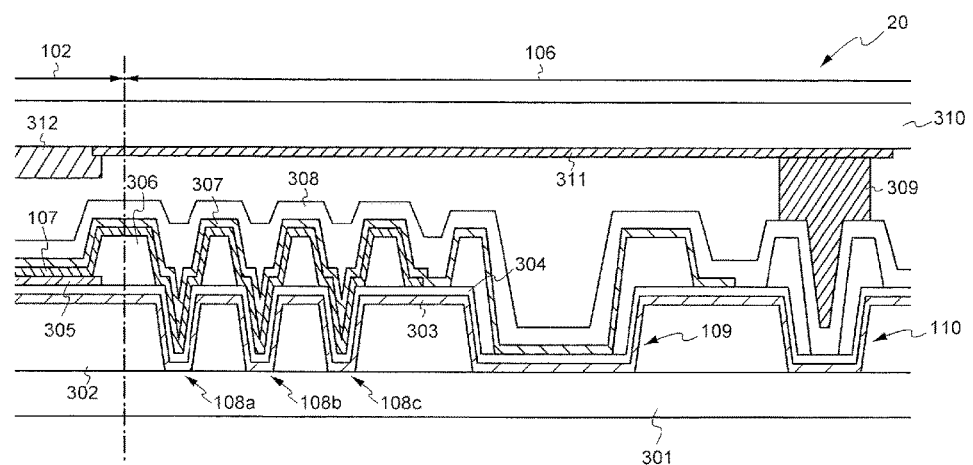
FIG. 9 is a cross-sectional view showing a structure of an organic EL display device in embodiment 2 according to the present invention.

FIG. 9 shows a schematic structure of an organic EL display device 20 in embodiment 2. Unlike the organic EL display device 10 in embodiment 1, the organic EL display device 20 includes a plurality of grooves 108. More specifically, the organic EL display device 20 in embodiment 2 includes three first grooves, namely, a first groove 108a, a first groove 108b and a first groove 108c. Except for this, the organic EL display device 20 is substantially the same as the organic EL display device 10 in embodiment 1.

In the organic EL display device 20, the display portion 102 is enclosed by the first groove 108a, the first groove 108b and the first groove 108c provided sequentially outward (toward the second groove 109) as seen in a plan view. In embodiment 2, the first groove 108a, the first groove 108b and the first groove 108c are located below the light emitting layer 107 like the first groove 108 in embodiment 1.

In embodiment 2, even if the scratch 1201 is caused at the position shown in FIG. 12 regarding the comparative example, the plurality of groove portions 108a, 108b and 108c disconnecting the first insulating layer 302 are located in the moisture entrance route. Therefore, as compared with in embodiment 1, the effect of blocking the moisture is further improved. Thus, the organic EL display device 20 is more reliable.

Embodiment 3

Figure 10:
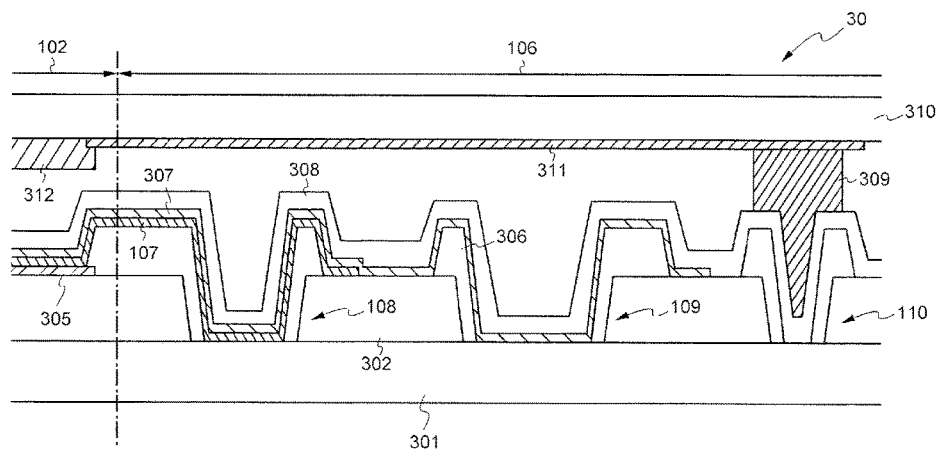
FIG. 10 is a cross-sectional view showing a structure of an organic EL display device in embodiment 3 according to the present invention.

FIG. 10 shows a schematic structure of an organic EL display device 30 in embodiment 3. Unlike the organic EL display device 10 in embodiment 1, the organic EL display device 30 does not include the conductive layer 303 or the second insulating layer 304. Except for this, the organic EL display device 30 is substantially the same as the organic EL display device 10 in embodiment 1.

In the organic EL display device 30 in embodiment 3, the positive electrode 305 is provided on the first insulating layer 302. Therefore, the width of the first groove 108 is greater than that in embodiment 1, and thus the effect of blocking the moisture is improved. Needless to say, the organic EL display device 30 may include a plurality of first grooves 108 like in embodiment 2.

In embodiment 3, the conductive layer 303 and the second insulating layer 304 are omitted. Alternatively, the conductive layer 303 may be omitted while the second insulating layer 304 may be provided. In this case, the inside surface of each of the first groove 108 and the second groove 109 is covered with the second insulating layer 304 formed of, for example, silicon nitride. Therefore, the effect of blocking the moisture is improved.

The above-described embodiments according to the present invention may be appropriately combined together as long as no contradiction occurs. Any embodiment obtained as a result of any addition, deletion, or design change of a component or any addition, deletion or condition change of a step being performed appropriately by a person of ordinary skill in the art with respect to any of the above-described embodiments is encompassed in the scope of the present invention as long as including the gist of the present invention.

Even a function or effect other than the function or effect provided by the above-described embodiments but is apparent from the description of this specification or would have been obvious to a person of ordinary skill in the art is construed as being provided by the present invention.

What is claimed is:

1. An organic EL display device, comprising:
   a first insulating layer; and
   a display portion provided on the first insulating layer, the display portion including a plurality of pixels;
   wherein:
   the display portion includes a light emitting layer included in organic EL elements included in the plurality of pixels, the light emitting layer being extended in the entirety of, and beyond, the display portion;
   the organic EL display device further includes a first groove enclosing the display portion as seen in a plan view, the first groove being provided in the first insulating layer at a position below the light emitting layer; and
   the organic EL display device further includes a second groove enclosing the first groove, the second groove being provided in the first insulating layer at a position further to the outer side of the light emitting layer as seen in a plan view.

2. The organic EL display device according to claim 1, further comprising a second insulating layer covering the first groove, the second insulating layer being provided between the first insulating layer and the light emitting layer.

3. The organic EL display device according to claim 2, wherein:
the first insulating layer contains a resin material; and
the second insulating layer contains silicon.

4. The organic EL display device according to claim 1, comprising a plurality of the first grooves as seen in a plan view.

5. The organic EL display device according to claim 1, further comprising a second insulating layer covering the first groove and the second groove.

6. The organic EL display device according to claim 5, wherein:
the first insulating layer contains a resin material; and
the second insulating layer contains silicon.

7. The organic EL display device according to claim 1, wherein:
the display is electrically connected with a terminal portion via a line;
as seen in a plan view, the line is physically disconnected into segments and the segments are electrically connected with each other via a conductive layer in an area where the line and the first groove cross each other, the conductive layer being provided below the line.

8. The organic EL display device according to claim 7, further comprising a third insulating layer provided between the line and the conductive layer;
wherein the line is electrically connected with the conductive layer via an opening provided in the third insulating layer.

9. The organic EL display device according to claim 7, wherein the segments of the conductive layer are separated from each other by a gap having a width greater than a width of the first groove.

* * * * *